United States Patent
Tian

(10) Patent No.: US 8,659,071 B2
(45) Date of Patent: Feb. 25, 2014

(54) METHOD AND STRUCTURE TO IMPROVE THE ERASING SPEED OPERATION OF SONOS MEMORY DEVICE HAVING A GRADED SILICON NITRIDE LAYER

(71) Applicant: Shanghai Huali Microelectronics Corporation, Shanghai (CN)

(72) Inventor: Zhi Tian, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 24 days.

(21) Appl. No.: 13/721,078

(22) Filed: Dec. 20, 2012

(65) Prior Publication Data

US 2013/0313628 A1    Nov. 28, 2013

(30) Foreign Application Priority Data

May 28, 2012  (CN) .......................... 2012 1 0170390

(51) Int. Cl.
   *H01L 29/66*  (2006.01)
(52) U.S. Cl.
   USPC .......... 257/325; 257/324; 257/406; 257/411; 257/E29.309; 438/37; 438/216; 438/287; 438/288

(58) Field of Classification Search
   None
   See application file for complete search history.

(56) References Cited

U.S. PATENT DOCUMENTS

| | | | |
|---|---|---|---|
| 5,291,048 A * | 3/1994 | Nakao | 257/325 |
| 7,029,976 B1 * | 4/2006 | Nagarad et al. | 438/258 |
| 2002/0014654 A1 * | 2/2002 | Rudeck et al. | 257/315 |
| 2005/0199944 A1 * | 9/2005 | Chen et al. | 257/324 |
| 2007/0029625 A1 * | 2/2007 | Lue et al. | 257/411 |
| 2008/0012065 A1 * | 1/2008 | Kumar | 257/324 |

* cited by examiner

*Primary Examiner* — Howard Weiss
*Assistant Examiner* — Cesar Lopez
(74) *Attorney, Agent, or Firm* — Anova Law Group, PLLC

(57) ABSTRACT

The invention provides a SONOS structure, a manufacturing method thereof and a semiconductor device with the SONOS structure. The SONOS structure comprises: a first tunneling oxide layer formed on a substrate, a charge storage silicon nitride layer, a second silicon oxide layer, a thin graded silicon nitride layer having graded Si/N content formed on the second silicon oxide layer, a third silicon oxide layer formed on the thin graded silicon nitride layer, and a polysilicon control gate. The Si/N content ratio of the silicon nitride of the thin graded silicon nitride layer increases gradually, wherein the silicon nitride of the graded silicon nitride layer closer to the second silicon oxide layer contains higher nitride content, and the silicon nitride of the graded silicon nitride layer closer to the third silicon oxide layer contains higher silicon content.

15 Claims, 2 Drawing Sheets

METHOD AND STRUCTURE TO IMPROVE THE ERASING SPEED OPERATION OF SONOS MEMORY DEVICE HAVING A GRADED SILICON NITRIDE LAYER

CROSS-REFERENCE TO RELATED APPLICATION

This application claims the priority benefit of China application serial no. 201210170390.8, filed May 28, 2012. All disclosure of the China application is incorporated herein by reference.

FIELD OF THE INVENTION

The present invention relates to the field of semiconductor manufacturing technology, and more particularly to a SONOS structure, a manufacturing method thereof and a semiconductor device with the SONOS structure.

BACKGROUND OF THE INVENTION

Flash memory is a kind of non-volatile memory and the conventional flash memory utilizes a floating gate for storing data. Since the polysilicon floating gate is electrically conductive, the charges stored therein are distributed continuously. When there is a charge leakage path, the charges stored in the whole floating gate will lose through the charge leakage path. Therefore, the biggest obstacle for scaling down the flash memory is that the thickness of the tunneling oxide layer in the flash memory cannot be constantly decreased, this is because the leakage current effect caused by the direct tunneling and stressing may occur when the tunneling oxide is made physically thinner, which brings a great challenge of controlling the current leakage of the flash memory. A recently developed SONOS structure utilizes a charge trapping silicon nitride layer instead of the conventional polysilicon floating gate to store the charges. Since the silicon nitride layer utilizes trapping levels to store charges, the charges stored in the silicon nitride layer will distribute discretely. Thus, one single leakage path will not lead to a large leakage current, and the reliability can be highly improved.

A typical SONOS structure includes a silicon substrate (S)-a tunneling oxide layer (O)-a charge storage silicon nitride layer (N)-a blocking oxide layer (O)-a polysilicon gate (S). The SONOS structure uses electron tunneling for data programming and hole injection for data erasing. A thinner tunneling oxide layer (about 3 nm) is used for enhancing the program and erasing speed. However, the thinner tunneling oxide layer suffers from the poor charge retention ability and program/erase endurance. Also, with a thicker tunneling oxide layer, larger electric field is required for programming and erasing, which will induce the electrons on the gate through the blocking oxide layer to the charge storage silicon nitride layer under a higher electric field in the process of erasing operation. The electron injection causes an erase saturation condition on which the injected electrons from the gate and the injected holes from the silicon substrate reach a dynamic equilibrium. Finally, if the electric field is too high, more electrons will be injected into the charge storage silicon nitride layer, thus the erase cannot be performed quickly and the property of the device may be influenced. Therefore, how to improve the efficiency of the tunneling oxide layer so as to simultaneously realize the high erasing speed, the good charge retention and endurance under a lower electric field is a new challenge.

Lue et al. (Publication no. US 2006/0198189A1 "Non-Volatile Memory Cells, Memory Arrays Including the Same and Method of Operation Cells and Arrays") discloses a bandgap engineered SONOS structure with a tunnel dielectric layer structure. Lue et al. ("BE-SONOS: A Bandgap Engineered SONOS with Excellent Performance and Reliability". IEEE 2005; "A BE-SONOS (Bandgap Engineered SONOS) NAND for Post-Floating Gate Era Flash Memory" IEEE 2007) further discusses about this type of structure. The BE-SONOS technology has been proved to be capable of providing good efficiency and realizing the simultaneous improvements in the erasing speed, the charge retention ability and the endurance.

Lue utilizes the bandgap difference of the silicon oxide and silicon nitride for forming a U-type bandgap structure, and designs an ONO layer with a thin silicon nitride layer N1 sandwiched between two thin oxide layers O1, O2 to replace the bottom oxide layer for quickly programming. The ultra-thin O1/N1/O2 layer serves as a non-trapping tunnel dielectric layer, through which the charges can pass before being trapped due to that the trapping mean free path is much longer than the thickness of the O1/N1/O2 layer. The layer N2 serves as a charge storage layer for storing the injected charges and the layer O3 serves as a blocking oxide layer for blocking the charge injection from the floating gate. The ultra-thin "O1/N1/O2 layer" structure provides a "modulated tunneling barrier", which suppresses the direct tunneling under a low electric field and allows efficient hole tunneling into the charge storage silicon nitride layer due to the band offset under a high electric field, so as to improve the erase efficiency.

When the thin ONO layer in the BE-SONOS structure mentioned above is used as the blocking oxide layer, the erasing operation can be performed using the hole injection from the gate. Since the thin ONO layer has negligible charge trapping ability, the holes can pass through it directly into the charge storage silicon nitride layer without being trapped, consequently the erasing operation is performed. Chinese Patents (CN200620093746.7 and CN200810186701.3) propose a non-volatile memory cell based on the BE-SONOS structure aforementioned to change the erasing method. The non-volatile memory cell utilizes the thin ONO layer to replace the blocking oxide layer and the non-volatile memory cell is erased by the hole injection from the heavily P-doped polysilicon gate. Although this method provides a new erasing way where the electron injection from the gate is suppressed by the positive electrode on the gate and the p-type doped polysilicon material of the gate during the erasing operation, it still needs a higher erasing voltage for initiating the hole injection from the gate to perform the erasing operation. However, a higher erasing voltage may cause the electron injection from the substrate into the charge storage silicon nitride layer, and thus affects the erasing speed.

SUMMARY OF THE INVENTION

Accordingly, at least one objective of the present invention is to provide a SONOS structure and a semiconductor device with the SONOS structure, by which the electron injection from the substrate under a high positive erasing voltage can be suppressed and the erasing speed can be improved.

To achieve these and other advantages and in accordance with the objective of the invention, as embodied and broadly described herein, the present invention is configured as follows.

In accordance with the first aspect of the present invention, it provides a SONOS structure comprising a first tunneling oxide layer formed on a substrate, a charge storage silicon nitride layer formed on the first tunneling oxide layer, a second silicon oxide layer formed on the charge storage silicon nitride layer, a thin graded silicon nitride layer having graded Si/N content formed on the second silicon oxide layer, a third silicon oxide layer formed on the thin graded silicon nitride layer, and a polysilicon control gate formed on the third silicon oxide layer.

Preferably, in the SONOS structure mentioned above, the Si/N content ratio of the silicon nitride of the thin graded silicon nitride layer increases gradually, wherein the silicon nitride of the graded silicon nitride layer closer to the second silicon oxide layer contains higher nitride content, and the silicon nitride of the graded silicon nitride layer closer to the third silicon oxide layer contains higher silicon content.

Preferably, in the SONOS structure mentioned above, the thin graded silicon nitride layer is formed under the condition of a $SiH_2Cl_2/NH_3$ gas flow-rate ratio gradually increased from 0.1 to 2.07 in the direction from the second silicon oxide layer to the third silicon oxide layer.

Preferably, in the SONOS structure mentioned above, the substrate is a P-type substrate.

Preferably, in the SONOS structure mentioned above, the charge storage silicon nitride layer is used for storing charges.

In accordance with the second aspect of the present invention, it provides a method of manufacturing a SONOS structure comprising: forming a first tunneling oxide layer on a substrate; depositing a charge storage silicon nitride layer above the first tunneling oxide layer; depositing a second silicon oxide layer above the charge storage silicon nitride layer; depositing a thin graded silicon nitride layer having graded Si/N content above the second silicon oxide layer; depositing a third silicon oxide layer above the thin graded silicon nitride layer; and forming a polysilicon control gate above the third silicon oxide layer.

Preferably, in the method of manufacturing the SONOS structure mentioned above, the Si/N content ratio of the silicon nitride of the thin graded silicon nitride layer increases gradually, wherein the silicon nitride of the thin graded silicon nitride layer closer to the second silicon oxide layer contains higher nitride content, and the silicon nitride of the thin graded silicon layer closer to the third silicon oxide layer contains higher silicon content.

Preferably, in the method of manufacturing the SONOS structure mentioned above, the thin graded silicon nitride layer is formed under the condition of a $SiH_2Cl_2/NH_3$ gas flow-rate ratio gradually increased from 0.1 to 2.07 in the direction from the second silicon oxide layer to the third silicon oxide layer.

Preferably, in the method of manufacturing the SONOS structure mentioned above, the substrate is a P-type substrate.

Preferably, in the method of manufacturing the SONOS structure mentioned above, the charge storage silicon nitride layer is used for storing charges.

In accordance with the third aspect of the present invention, it provides a semiconductor device with the SONOS structure aforementioned.

The present invention provides a silicon nitride device with tapered bandgap structure by applying the band engineering to the blocking oxide layer to achieve higher erasing speed. A thin stacked OTNO layer comprising a second silicon oxide layer/a thin graded silicon nitride layer/a third silicon oxide layer is used to replace the blocking oxide layer in the conventional SONOS structure to achieve the band offset under a lower erasing voltage so as to reduce the influence of the electron injection from the substrate upon the hole injection from the gate in the erasing operation under a high gate voltage and enhance the erasing speed.

BRIEF DESCRIPTION OF THE DRAWINGS

The SONOS structure, manufacturing method thereof and semiconductor device with the SONOS structure of the present invention will be elucidated by reference to the following embodiments and the accompanying drawings, in which.

DETAILED DESCRIPTION OF THE EMBODIMENTS

Figure 1:
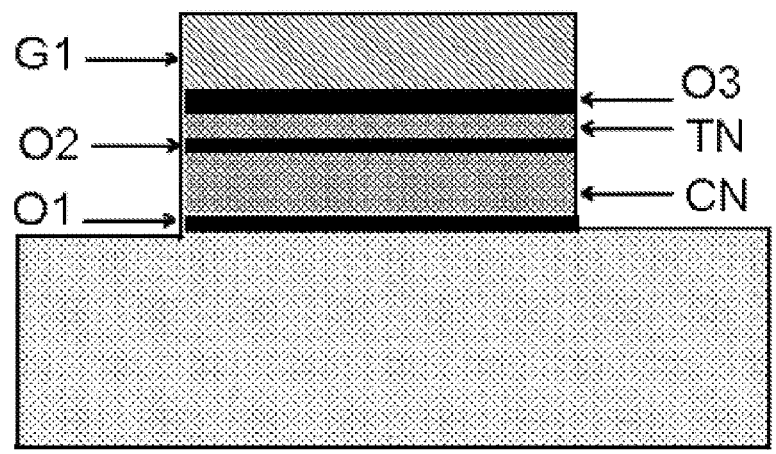
FIG. 1 is a cross-sectional view of the SONOS structure in an embodiment of the present invention.

The SONOS structure, manufacturing method of the SONOS structure and the semiconductor device with the SONOS structure of the present invention will be described in further details hereinafter with respect to the embodiments and the accompanying figures, wherein like reference numerals are used throughout the figures to designate similar or equivalent element, the figures are not drawn to scale and they are provided merely to illustrate the invention instead of limiting the scope of the present invention.

Embodiment 1

FIG. 1 is a cross-sectional view of a SONOS structure in an embodiment in the present invention.

Referring to FIG. 1, the SONOS structure in an embodiment of the present invention comprises: a first tunneling oxide layer O1 formed on a substrate, a charge storage silicon nitride layer CN formed on the first tunneling oxide layer O1, a second silicon oxide layer O2 formed on the charge storage silicon nitride layer CN, a thin graded silicon nitride layer with graded Si/N content TN (tapered nitride) formed on the second silicon oxide layer O2, a third silicon oxide layer O3 formed on the thin graded silicon nitride layer TN, and a polysilicon control gate G1 formed on the third silicon oxide layer O3.

In the embodiment, the substrate aforementioned is preferred to be a P-type substrate S1, as shown in FIG. 1. The first tunneling oxide layer O1 can be 3~4 nm in thickness, and is preferably to be 3.5 nm. The charge storage silicon nitride layer CN can be 6~8 nm in thickness, and is preferably to be 7 nm. The second silicon oxide layer O2 can be 1.8~2.5 nm in thickness, and is preferably to be 2 nm. The thickness of the thin graded silicon nitride layer TN can be 1.2~2.2 nm, and is preferably to be 1.5 nm. The thickness of the third silicon oxide layer O3 can be 1.8~3 nm, and is preferably to be 2 nm.

The Si/N content ratio of the silicon nitride of the thin graded silicon nitride layer TN increases gradually, wherein the silicon nitride of the thin graded silicon nitride layer closer to the second silicon oxide layer O2 contains higher nitride content, and the silicon nitride of the thin graded silicon nitride layer closer to the third silicon oxide layer O3 contains higher silicon content. Specifically, in a preferred embodiment, the thin graded silicon nitride layer is formed under the condition of a the $SiH_2Cl_2/NH_3$ gas flow-rate ratio gradually increases from 0.1 to 2.07 in the direction from the second silicon oxide layer O2 to the third silicon oxide layer O3.

Embodiment 2

The method of manufacturing the SONOS structure in an embodiment of the present invention will be described as follows.

During the manufacturing process of the SONOS structure, at first, a first tunneling oxide layer O1 (a bottom silicon oxide layer) is formed on a substrate; the substrate can be a P-type substrate, the thickness of the first tunneling oxide layer O1 can be 3~4 nm, and is preferably to be 3.5 nm.

Secondly, a charge storage silicon nitride layer CN (a silicon nitride layer for storing charges) is deposited above the first tunneling oxide layer O1; the thickness of the charge storage silicon nitride layer CN can be 6~8 nm, and is preferably to be 7 nm.

Then, a second silicon oxide layer O2 (a lower silicon oxide layer) is deposited above the charge storage silicon nitride layer CN; the thickness of the second silicon oxide layer O2 can be 1.8~2.5 nm, and is preferably to be 2 nm.

Afterwards, a thin graded silicon nitride layer TN (tapered nitride) having graded Si/N content is formed above the second silicon oxide layer O2, the thickness of the thin graded silicon nitride layer TN can be 1.2~2.2 nm, and is preferably to be 1.5 nm. The details of the method of manufacturing the thin graded silicon nitride layer TN can refer to the scientific paper (Wu K H, Chen H C, Chan C C, et al. "SONOS Device with Tapered Bandgap Nitride Layer". IEEE T Electron Dev, 2005, 52 (5): 987-992.), and the Chinese patent (application serial no. 200910057131.2. "the olive bandgap structure of the silicon nitride trapping layer in the SONOS device and the manufacturing method thereof"). The Si/N content ratio of the thin graded silicon nitride layer TN increases gradually, a nitride-rich silicon nitride layer is formed near the lower oxide layer, and with the increase of the Si/N content ratio, a silicon-rich silicon nitride layer is formed in the upper part of the thin graded silicon nitride layer TN.

Then, a third silicon oxide layer O3 (an upper silicon oxide layer) is formed above the thin graded silicon nitride layer TN, the thickness of the third silicon oxide layer O3 can be 1.8~3 nm, and is preferably to be 2 nm. The silicon-rich silicon nitride layer is formed near the upper silicon oxide layer O3.

Finally, a polysilicon control gate G1 is formed above the third silicon oxide layer O3.

The Si/N content ratio of the silicon nitride of the thin graded silicon nitride layer TN increases gradually, wherein the silicon nitride of the thin graded silicon nitride layer closer to the second silicon oxide layer O2 contains higher nitride content, and the silicon nitride closer to the third silicon oxide layer O3 contains higher silicon content. Specifically, in a preferred embodiment, the thin graded silicon nitride layer TN is formed under the condition of a $SiH_2Cl_2/NH_3$ gas flow-rate ratio gradually increased from 0.1 to 2.07 in the direction from the second silicon oxide layer O2 to the third silicon oxide layer O3.

Figure 2:
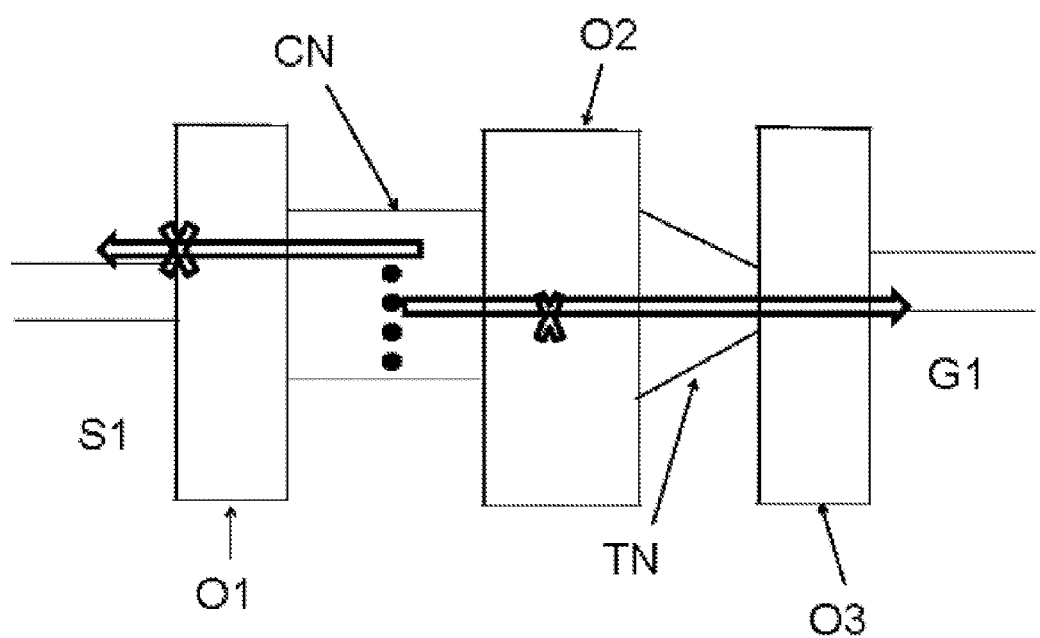
FIG. 2 is a band diagram of the SONOS structure in a charge retention state under the zero electric field in an embodiment of the present invention.

Through the above procedures, a SONOS structure is manufactured in which an O2/TN/O3 layer with tapered bandgap structure replaces the blocking oxide layer so as to perform the erasing operation through hole injection FIG. 2 is a band diagram of the SONOS structure having the O2/TN/O3 layer in a charge retention state under the zero electric field in an embodiment of the present invention. In FIG. 2, the solid circles represent the electrons. The first tunneling oxide layer O1 serves as the bottom silicon oxide layer, which can prevent the charges in the charge storage silicon nitride layer turning back into the substrate. The O2/TN/O3 layer including the second silicon oxide layer O2/the thin graded silicon nitride layer TN/the third silicon oxide layer O3 can prevent the stored charge moving to the polysilicon gate so as to maintain a better charge retention ability.

Figure 3:
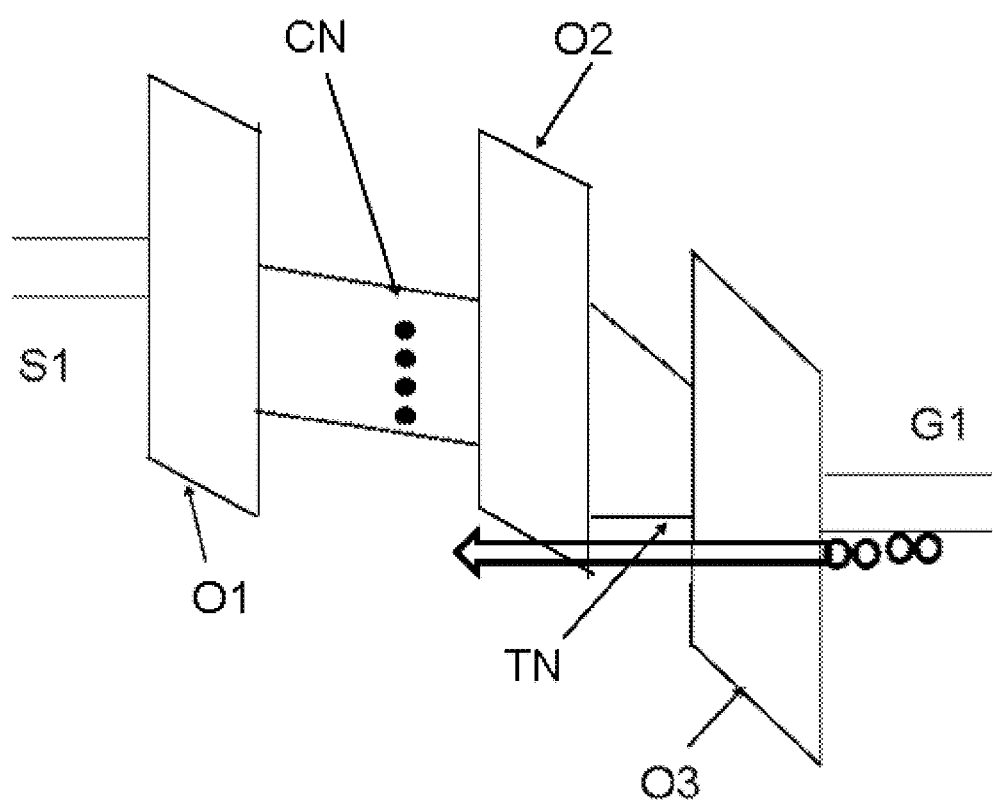
FIG. 3 is a band diagram of the SONOS structure in an erase state in an embodiment of the present invention.

FIG. 3 is a band diagram of the SONOS structure having the O2/TN/O3 layer in an erase state in an embodiment of the present invention. In FIG. 3, the solid circles represent the electrons, and the hollow circles represent the holes. Since the erase is performed by the hole FN (Fowler-Nordheim) tunneling, during the erasing operation with a positive gate voltage applied, the tapered bandgap structure of the graded Si/N content silicon nitride layer TN in the O2/TN/O3 layer offsets upward, which leads to an upward shift of the valance band near the lower silicon oxide layer (the second silicon oxide layer O2). When the energy level of the valance band of the broad bandgap in the tapered bandgap structure and that of the valance band of the narrow bandgap in the tapered bandgap structure are equal, and are also equal to the energy level of the valence band of the silicon substrate, the graded silicon nitride layer TN will not affect the hole tunneling, and the applied positive voltage at that time is the lowest needed voltage. Meanwhile, the bandgap of the lower silicon oxide layer (the second silicon oxide layer O2) also offsets and will not affect the hole tunneling. Thus, a larger band offset can be performed without applying a too high voltage, and the probability of the electron injection from the substrate to the charge storage silicon nitride layer is reduced under the lower voltage, so as to realize the high erasing speed.

As shown in the band diagram, to ensure the holes injected to the first tunneling oxide layer O1, the bandgap of the thin graded silicon nitride layer TN and the upper oxide layer O3 must offset to a certain degree. The band offset for ensuring the hole tunneling through the middle dielectric layer (the graded thin silicon nitride layer TN) depends on the hole barrier of the thin graded silicon nitride layer TN. The band offset of the lower oxide layer (the second silicon oxide layer O2) can also affect the hole injection into the charge storage silicon nitride layer CN during erasing.

Consequently, by using the thin graded silicon nitride layer TN with graded Si/N content and tapered bandgap structure in the O2/TN/O3 layer instead of the middle silicon nitride layer in the thin ONO layer, the band offset of the tapered bandgap structure can be beneficial to reduce the erasing voltage and increase the erasing speed during the erasing operation.

Specifically, the present invention provides a SONOS device with a tapered bandgap structure of the silicon nitride and a higher erasing speed by applying the band engineering in the conventional blocking oxide layer. A thin staked OTNO layer comprising a second silicon oxide layer O2/a thin graded silicon nitride layer TN/a third silicon oxide layer O3 is used to replace the blocking oxide layer in the conventional SONOS structure to achieve the band offset under a lower erasing voltage so as to reduce the influence of the electron injection from the substrate upon the hole injection from the gate at the erase state under a high gate voltage and thus enhance the erasing speed.

The present invention utilizes a stacked OTNO structure having tapered bandgap instead of the blocking oxide layer in the conventional SONOS structure to reduce the erasing operation voltage applied on the SONOS structure by which the erase is performed due to the hole injection from the gate. Since the tapered bandgap structure exhibits a certain band offset under a lower positive erasing voltage, the needed erasing voltage can be reduced, the electron injection from the substrate under a higher erase positive voltage can be suppressed and the erasing speed can be enhanced. Further-more, the present invention can be applied widely in the devices with the SONOS structure.

In accordance with another preferable embodiment of the present invention, a semiconductor device with the SONOS structure aforementioned is provided.

Although the present invention has been disclosed as above with respect to the preferred embodiments, they should not be construed as limitations to the present invention. Various modifications and variations can be made by the ordinary skilled in the art without departing the spirit and scope of the present invention. Therefore, the protection scope of the present invention should be defined by the appended claims.

The invention claimed is:

1. A SONOS structure comprising:
a first tunneling oxide layer formed on a substrate, a charge storage silicon nitride layer formed on the first tunneling oxide layer, a second silicon oxide layer formed on the charge storage silicon nitride layer, a thin graded silicon nitride layer having graded Si/N content formed on the second silicon oxide layer, a third silicon oxide layer deposited on the thin graded silicon nitride layer, and a polysilicon control gate formed on the third silicon oxide layer, wherein during the erasing operation through the hole injection from the gate into the charge storage silicon nitride layer with a positive gate voltage applied, the bandgap of the thin graded silicon nitride layer offsets upwards so that not to affect the hole injection.

2. The SONOS structure according to claim 1, wherein the substrate is a P-type substrate.

3. The SONOS structure according to claim 1, wherein the charge storage silicon nitride layer is used for storing charges.

4. The SONOS structure according to claim 1, wherein the Si/N content ratio of the silicon nitride of the thin graded silicon nitride layer is increased gradually, wherein the silicon nitride of the thin graded silicon nitride layer closer to the second silicon oxide layer contains higher nitride content, and the silicon nitride of the thin graded silicon nitride layer closer to the third silicon oxide layer contains higher silicon content.

5. The SONOS structure according to claim 4, wherein the thin graded silicon nitride layer is formed under the condition of a $SiH_2Cl_2/NH_3$ gas flow-rate ratio gradually increased from 0.1 to 2.07 in the direction from the second silicon oxide layer to the third silicon oxide layer.

6. A method of manufacturing a SONOS structure comprising:
forming a first tunneling oxide layer on a substrate;
depositing a charge storage silicon nitride layer above the first tunneling oxide layer;
depositing a second silicon oxide layer above the charge storage silicon nitride layer;
depositing a thin graded silicon nitride layer having graded Si/N content above the second silicon oxide layer;
depositing a third silicon oxide layer above the thin graded silicon nitride layer; and
forming a polysilicon control gate above the third silicon oxide layer, wherein during the erasing operation through the hole injection from the gate into the charge storage silicon nitride layer with a positive gate voltage applied, the bandgap of the thin graded silicon nitride layer offsets upwards so that not to affect the hole injection.

7. The method according to claim 6, wherein the substrate is a P-type substrate.

8. The method according to claim 6, wherein the charge storage silicon nitride layer is used for storing charges.

9. The method according to claim 6, wherein the Si/N content ratio of the silicon nitride in the thin graded silicon nitride layer is increased gradually, wherein the silicon nitride of the thin graded silicon nitride layer closer to the second silicon oxide layer contains higher nitride content, and the silicon nitride of the thin graded silicon layer closer to the third silicon oxide layer contains higher silicon content.

10. The method according to claim 9, wherein the thin graded silicon nitride layer is formed under the condition of a $SiH_2Cl_2/NH_3$ gas flow-rate ratio gradually increased from 0.1 to 2.07 in the direction from the second silicon oxide layer to the third silicon oxide layer.

11. A semiconductor device with a SONOS structure, wherein the SONOS structure comprises:
a first tunneling oxide layer formed on a substrate, a charge storage silicon nitride layer formed on the first tunneling oxide layer, a second silicon oxide layer formed on the charge storage silicon nitride layer, a thin graded silicon nitride layer having graded Si/N content formed on the second silicon oxide layer, a third silicon oxide layer deposited on the thin graded silicon nitride layer, and a polysilicon control gate formed on the third silicon oxide layer, wherein during the erasing operation through the hole injection from the gate into the charge storage silicon nitride layer with a positive gate voltage applied, the bandgap of the thin graded silicon nitride layer offsets upwards so that not to affect the hole injection.

12. The semiconductor device according to claim 11, wherein the substrate is a P-type substrate.

13. The semiconductor device according to claim 11, wherein the charge storage silicon nitride layer is used for storing charges.

14. The semiconductor device according to claim 11, wherein the Si/N content ratio of the silicon nitride of the thin graded silicon nitride layer is increased gradually, wherein the silicon nitride of the thin graded silicon nitride layer closer to the second silicon oxide layer contains higher nitride content, and the silicon nitride of the thin graded silicon nitride layer closer to the third silicon oxide layer contains higher silicon content.

15. The semiconductor device according to claim 14, wherein the thin graded silicon nitride layer is formed under the condition of a $SiH_2Cl_2/NH_3$ gas flow-rate ratio is increased gradually increased from 0.1 to 2.07 in the direction from the second silicon oxide layer to near the third silicon oxide layer.

* * * * *